United States Patent
Herrmann

(10) Patent No.: US 11,282,991 B2
(45) Date of Patent: Mar. 22, 2022

(54) METHOD OF PRODUCING AN OPTOELECTRONIC COMPONENT, AND OPTOELECTRONIC COMPONENT

(71) Applicant: OSRAM Opto Semiconductors GmbH, Regensburg (DE)

(72) Inventor: Siegfried Herrmann, Neukirchen (DE)

(73) Assignee: OSRAM OLED GmbH, Regensburg (DE)

( * ) Notice: Subject to any disclaimer, the term of this patent is extended or adjusted under 35 U.S.C. 154(b) by 613 days.

(21) Appl. No.: 16/065,371

(22) PCT Filed: Dec. 20, 2016

(86) PCT No.: PCT/EP2016/081938
§ 371 (c)(1),
(2) Date: Jun. 22, 2018

(87) PCT Pub. No.: WO2017/108800
PCT Pub. Date: Jun. 29, 2017

(65) Prior Publication Data
US 2020/0251627 A1    Aug. 6, 2020

(30) Foreign Application Priority Data
Dec. 22, 2015 (DE) .................. 10 2015 122 641.3

(51) Int. Cl.
*H01L 33/52* (2010.01)
*G02B 6/42* (2006.01)
*H01L 23/00* (2006.01)

(52) U.S. Cl.
CPC ............ *H01L 33/52* (2013.01); *G02B 6/4274* (2013.01); *H01L 24/12* (2013.01); *H01L 2933/005* (2013.01)

(58) Field of Classification Search
CPC ........................................... H01L 33/52
USPC .............................................. 438/26
See application file for complete search history.

(56) References Cited

U.S. PATENT DOCUMENTS

2009/0121241 A1    5/2009  Keller et al.
2010/0148198 A1    6/2010  Sugizaki et al.
2013/0087823 A1*   4/2013  Tsai .................. H01L 33/38
                                                  257/98

(Continued)

FOREIGN PATENT DOCUMENTS

DE    10 2013 221 788 A1    4/2015
DE    10 2014 102 183 A1    8/2015

(Continued)

*Primary Examiner* — Hsin Yi Hsieh
(74) *Attorney, Agent, or Firm* — DLA Piper LLP (US)

(57) ABSTRACT

A method of producing an optoelectronic component includes providing an opto-electronic semiconductor chip including a layer sequence arranged on a substrate, wherein the layer sequence includes a contact side including two electrical contact locations, the contact side facing away from the substrate; arranging the optoelectronic semiconductor chip on an auxiliary carrier such that the contact side faces away from the auxiliary carrier; arranging a molding material above the auxiliary carrier such that a housing is formed that at least partly encloses the optoelectronic semiconductor chip, wherein the contact side is covered by the molding material; and detaching the housing from the auxiliary carrier.

12 Claims, 13 Drawing Sheets

(56) References Cited

U.S. PATENT DOCUMENTS

2013/0221406 A1* 8/2013 Gaska ............... H01L 29/66431
  257/191
2013/0248910 A1* 9/2013 Kimura ................ H01L 25/167
  257/98
2017/0222094 A1* 8/2017 Haiberger ............... H01L 33/62

FOREIGN PATENT DOCUMENTS

| | | |
|---|---|---|
| DE | 10 2014 102 258 A1 | 8/2015 |
| DE | 10 2014 103 034 A1 | 9/2015 |
| DE | 10 2014 108 377 A1 | 12/2015 |
| JP | 2010-141176 | 6/2010 |
| WO | 2013/182980 | 12/2013 |
| WO | 2015/074824 A1 | 5/2015 |
| WO | 2015/181072 A1 | 12/2015 |

* cited by examiner

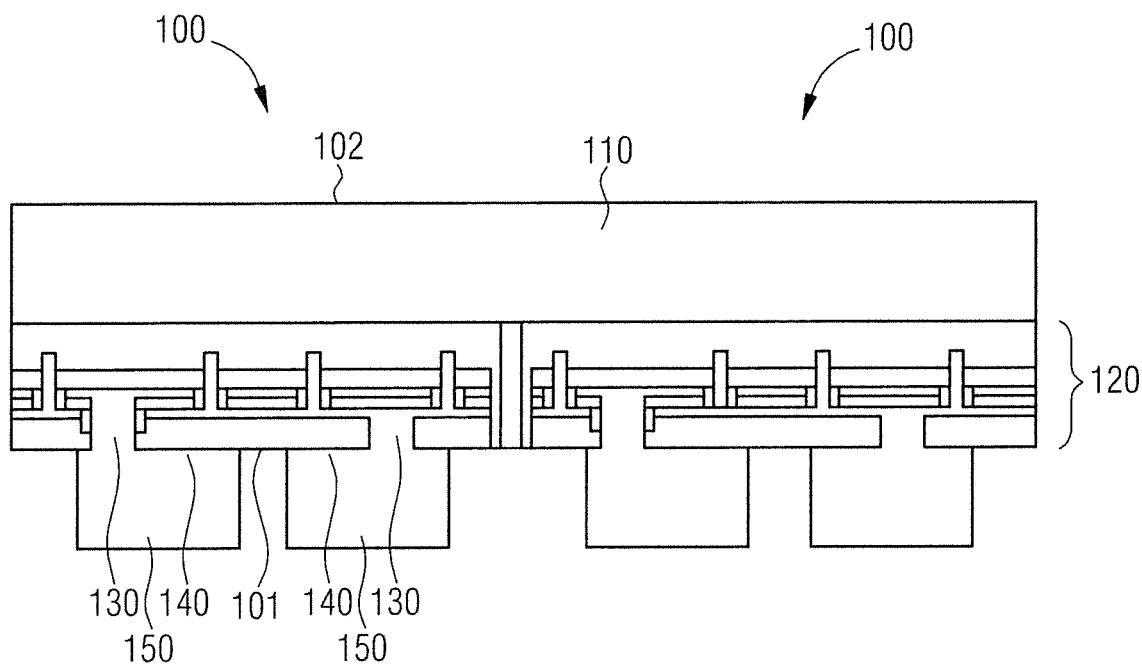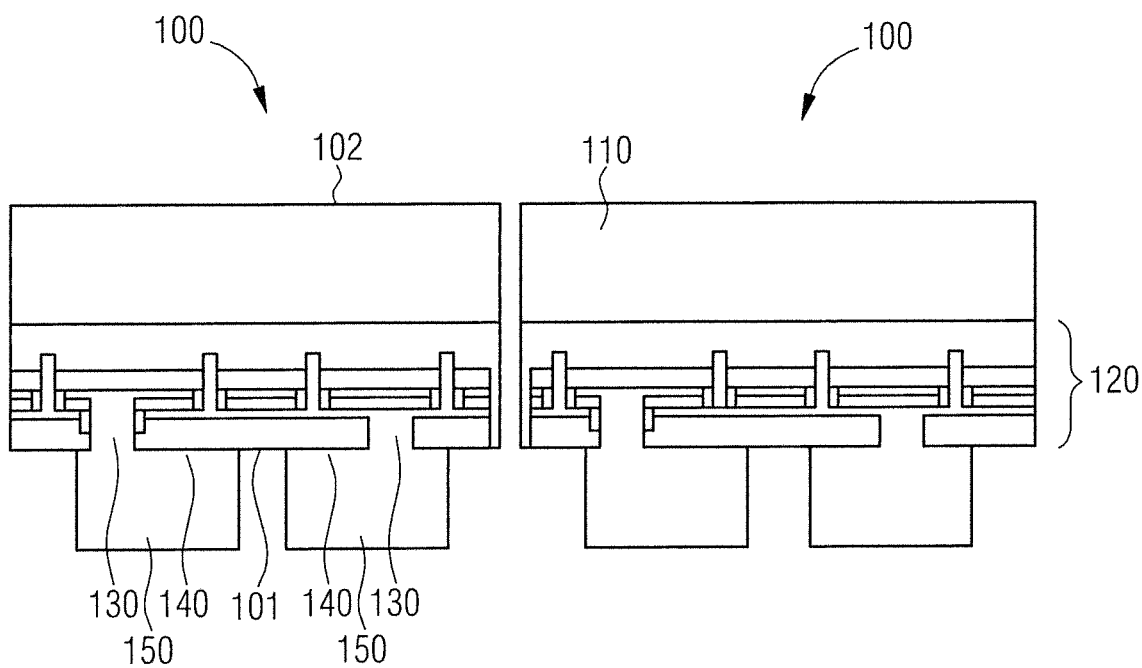

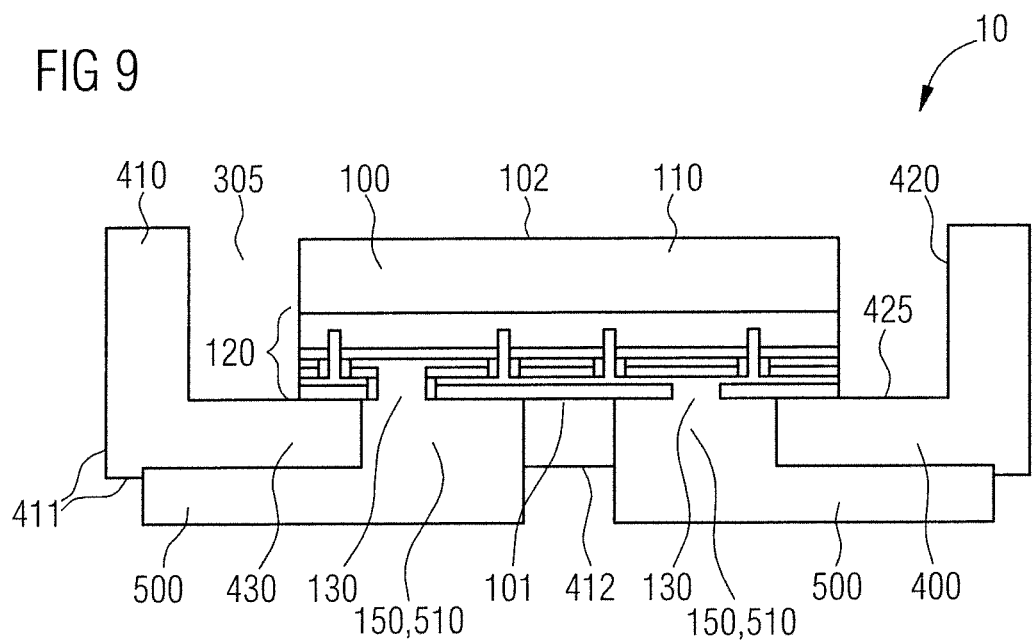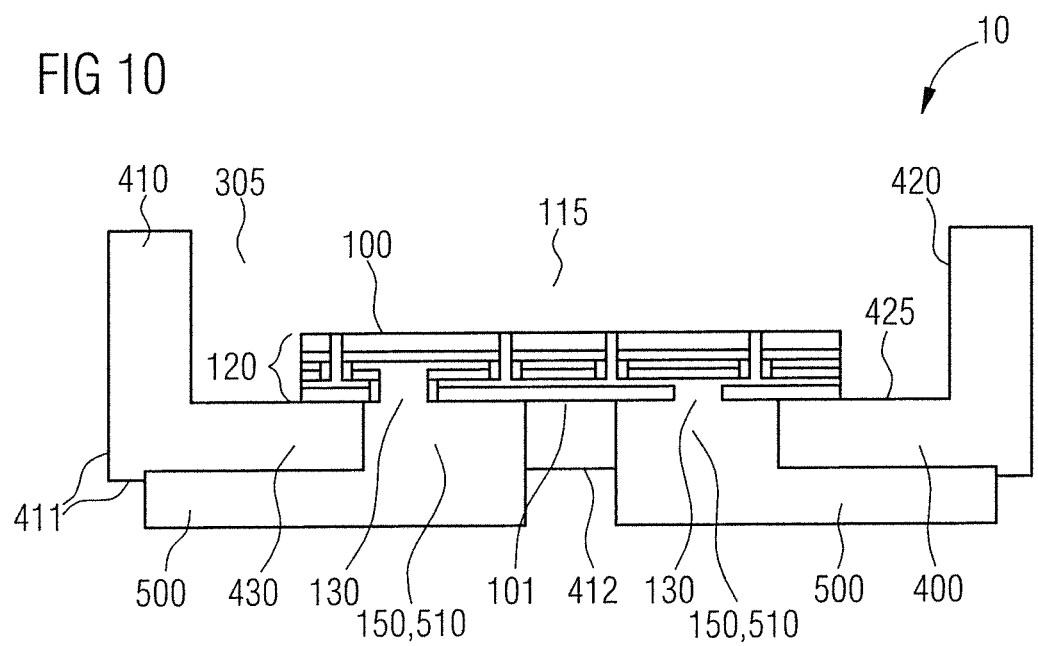

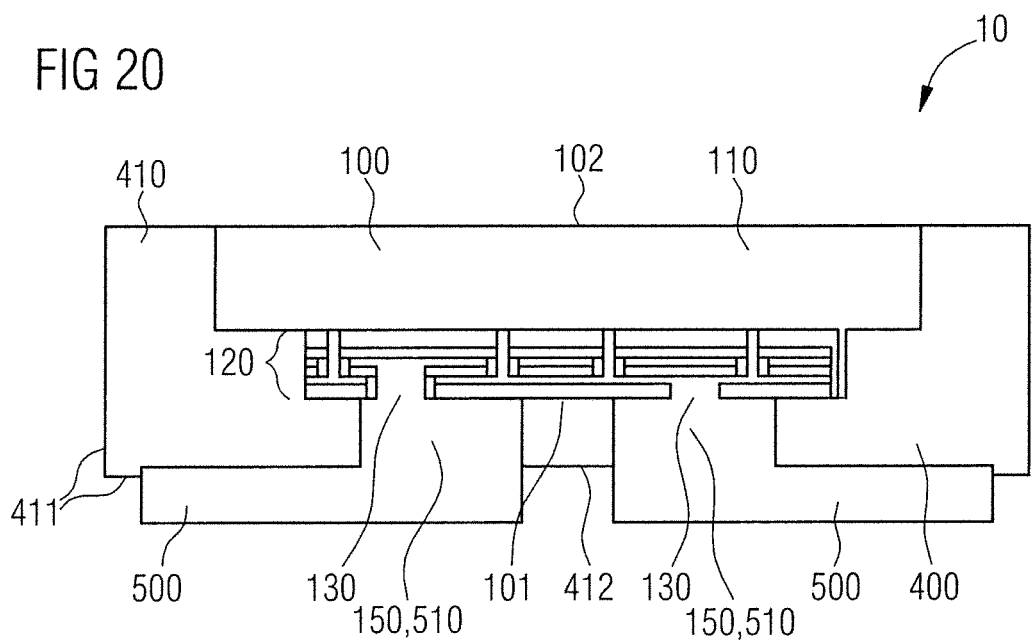
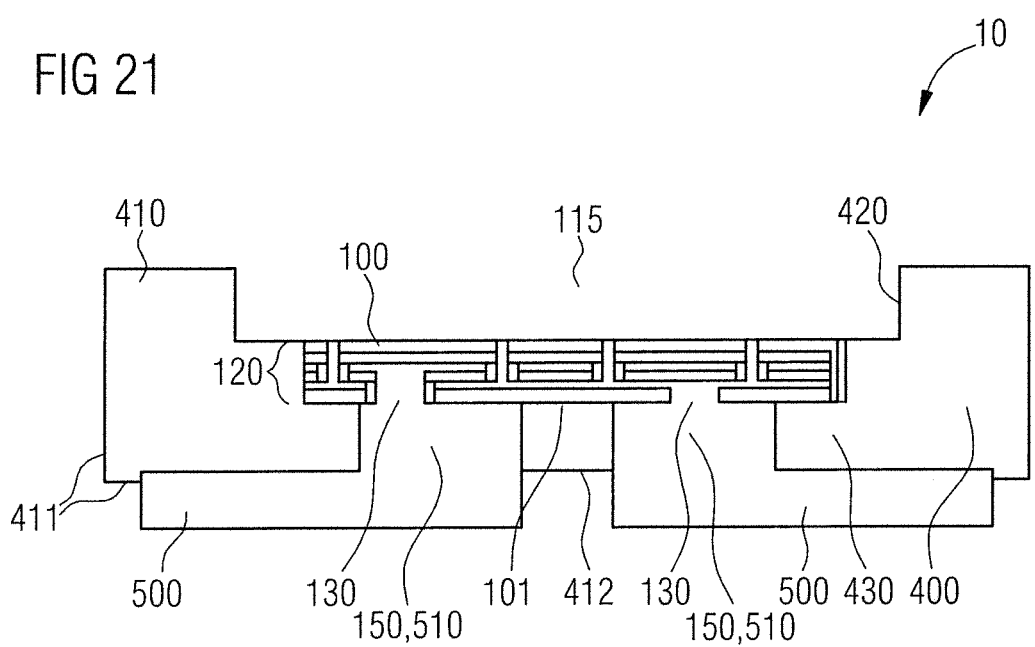

METHOD OF PRODUCING AN OPTOELECTRONIC COMPONENT, AND OPTOELECTRONIC COMPONENT

TECHNICAL FIELD

This disclosure relates to a method of producing an optoelectronic component, and an optoelectronic component.

BACKGROUND

Various housing designs for optoelectronic components are known. For many applications, it is desirable to form the housings of optoelectronic components with the smallest possible dimensions. At the same time, the housings of optoelectronic components are intended to enable the broadest possible spectrum of different uses.

SUMMARY

I provide a method of producing an optoelectronic component including providing an optoelectronic semiconductor chip including a layer sequence arranged on a substrate, wherein the layer sequence includes a contact side including two electrical contact locations, the contact side facing away from the substrate; arranging the optoelectronic semiconductor chip on an auxiliary carrier such that the contact side faces away from the auxiliary carrier; arranging a molding material above the auxiliary carrier such that a housing is formed that at least partly encloses the optoelectronic semiconductor chip, wherein the contact side is covered by the molding material; and detaching the housing from the auxiliary carrier.

I also provide an optoelectronic component including a housing including a cavity, wherein a layer sequence of an optoelectronic semiconductor chip is arranged at a bottom of the cavity.

BRIEF DESCRIPTION OF THE DRAWINGS

FIG. 3 schematically shows a sectional side view of the optoelectronic semiconductor chip with internal electrical contact pads created at the electrical contact locations.

FIG. 4 schematically shows a sectional side view of the optoelectronic semiconductor chip after singulating the optoelectronic semiconductor chip.

FIG. 9 schematically shows a sectional side view of a finished processed optoelectronic component in accordance with a first example.

FIG. 10 schematically shows a sectional side view of an optoelectronic component in accordance with a second example.

FIG. 20 schematically shows a sectional side view of an unfinished optoelectronic component in accordance with an eighth example.

FIG. 21 schematically shows a sectional side view of the optoelectronic component of the eighth example.

Figure 1:
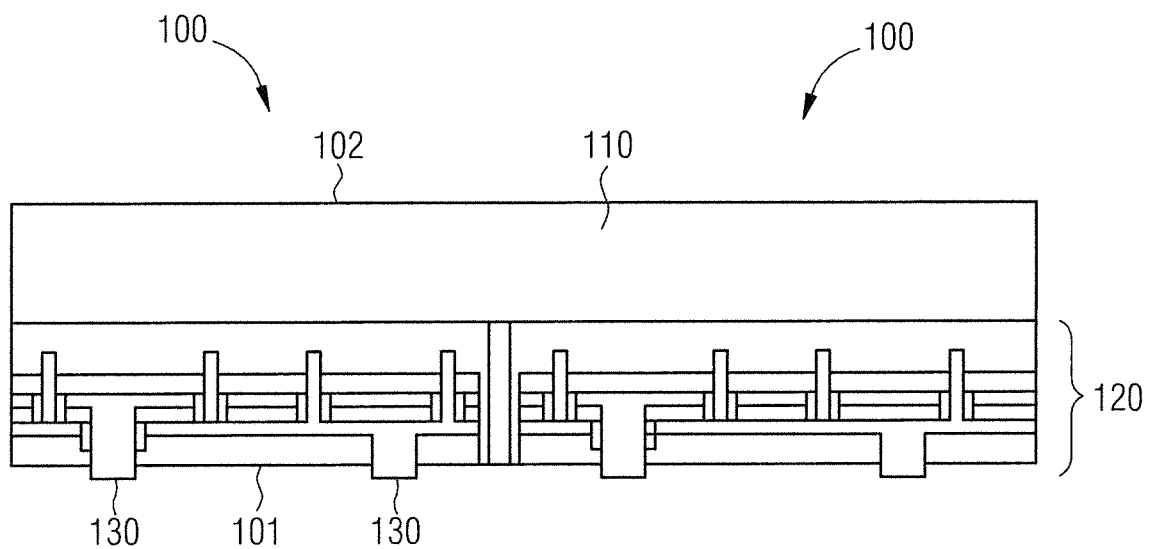
FIG. 1 schematically shows a sectional side view of an optoelectronic semiconductor chip.

| List of Reference Signs | |
|---|---|
| Optoelectronic component | 10 |
| Optoelectronic semiconductor chip | 100 |
| Contact side | 101 |
| Rear side | 102 |
| Substrate | 110 |
| Free space | 115 |
| Layer sequence | 120 |
| Electrical contact location | 130 |
| Seed layer | 140 |
| Internal electrical contact pad | 150 |
| Temporary carrier | 200 |

List of Reference Signs

| | |
|---|---|
| Auxiliary carrier | 210 |
| Sacrificial layer | 300 |
| Convex sidewall | 301 |
| Concave sidewall | 302 |
| Free space | 305 |
| Wavelength-converting material | 310 |
| Wavelength-converting element | 320 |
| Potting material | 330 |
| Potting material | 340 |
| Molding material | 400 |
| Part of the molding material | 405 |
| Housing | 410 |
| Exterior side of the housing | 411 |
| Rear side of the housing | 412 |
| Housing assemblage | 415 |
| Cavity | 420 |
| Concave wall | 421 |
| Convex wall | 422 |
| Bottom of the cavity | 425 |
| Base region of the housing | 430 |
| External electrical contact pad | 500 |
| Electrically conductive connection | 510 |
| Lateral electrical contact pad | 520 |
| Thermal contact pads | 530 |

DETAILED DESCRIPTION

My method of producing an optoelectronic component comprises steps of providing an optoelectronic semiconductor chip comprising a layer sequence arranged on a substrate, wherein the layer sequence comprises a contact side comprising two electrical contact locations, the contact side facing away from the substrate, arranging the optoelectronic semiconductor chip on an auxiliary carrier such that the contact side faces away from the auxiliary carrier, arranging a molding material above the auxiliary carrier such that a housing is formed, which at least partly encloses the optoelectronic semiconductor chip, wherein the contact side is covered by the molding material, and detaching the housing from the auxiliary carrier. The housing of the optoelectronic component obtainable by this method thus serves directly as a carrier for the layer sequence of the optoelectronic semiconductor chip. In this case, the housing may advantageously be formed with very compact external dimensions.

After detaching the housing from the auxiliary carrier, a further step may be carried out to remove the substrate, wherein the layer sequence remains at the molding material of the housing. Advantageously, the optoelectronic component obtainable by this method may comprise particularly compact external dimensions. This is achieved in particular by virtue of the fact that the molding material of the housing of the optoelectronic component obtainable by the method serves as a carrier for the layer sequence of the optoelectronic semiconductor chip, as a result of which a further carrier is not required.

After removing the substrate a further step may be carried out to arrange a wavelength-converting material in a free space produced as a result of removing the substrate. The wavelength-converting material may convert electromagnetic radiation emitted by the optoelectronic semiconductor chip of the optoelectronic component obtainable by the method at least partly into electromagnetic radiation of a different wavelength. Arranging the wavelength-converting material in the free space produced as a result of removing the substrate advantageously makes it possible to produce an optoelectronic component with very small external dimensions. One particular advantage is that the free space arising as a result of removing the substrate is automatically aligned with the layer sequence of the optoelectronic semiconductor chip, as a result of which a good alignment of the wavelength-converting material with the light emitting layer sequence of the optoelectronic semiconductor chip is achieved.

Removing the substrate may be carried out by a laser detaching process. Advantageously, this enables the substrate to be removed simply and reliably.

The substrate may be formed as a sapphire substrate. The layer sequence in this case may comprise GaN, for example. Advantageously, a substrate formed as a sapphire substrate is suitable for removal by a laser detaching process.

Removing the substrate may be carried out by an etching method. Advantageously, this also enables the substrate to be removed reliably.

The substrate may comprise silicon. The layer sequence of the optoelectronic semiconductor chip in this case may comprise GaN, for example. Advantageously, a substrate comprising silicon may be removed reliably by an etching method.

Before arranging the optoelectronic semiconductor chip on the auxiliary carrier further steps may be carried out to arrange the optoelectronic semiconductor chip on a temporary carrier such that the contact side faces the temporary carrier, arranging a sacrificial layer above the temporary carrier such that the optoelectronic semiconductor chip is embedded into the sacrificial layer, and detaching the optoelectronic semiconductor chip with the surrounding sacrificial layer from the temporary carrier. In addition, after detaching the housing from the auxiliary carrier, a further step is carried out to dissolve away the sacrificial layer. Advantageously, this method makes it possible to form a cavity in the housing of the optoelectronic component. In this case, the optoelectronic semiconductor chip is arranged in the cavity of the housing as early as during production of the housing such that the layer sequence of the optoelectronic semiconductor chip is arranged at a bottom of the cavity and carried by the molding material of the housing. The cavity formed in the housing by the method may advantageously bring about gathering and focusing of electromagnetic radiation emitted by the optoelectronic semiconductor chip of the optoelectronic component. Moreover, the cavity may advantageously receive a potting material and/or a wavelength-converting material, which may afford protection of the optoelectronic semiconductor chip against damage as a result of external influences and convert at least part of an electromagnetic radiation emitted by the optoelectronic semiconductor chip of the optoelectronic component into electromagnetic radiation of a different wavelength.

Embedding the optoelectronic semiconductor chip into the sacrificial layer may be carried out by immersing the optoelectronic semiconductor chip in the material of the sacrificial layer. Advantageously, this enables the sacrificial layer to be arranged above the temporary carrier simply, rapidly and cost-effectively. One particular advantage of this method is that different shapes of the sacrificial layer covering the optoelectronic semiconductor chip are possible depending on the choice of surface tension of the material of the sacrificial layer. In this regard, individual surface sections of the optoelectronic semiconductor chip may be covered by the sacrificial layer more thickly than other surface sections of the optoelectronic semiconductor chip. Since the shape of the sacrificial layer covering the optoelectronic semiconductor chip predefines a shape of a cavity formed later in the housing of the optoelectronic component obtainable by the method, the method thereby makes it possible to predefine a desired geometry of the subsequent cavity formed by a choice of a desired surface tension of the material of the sacrificial layer.

After dissolving away the sacrificial layer a further step may be carried out to arrange a wavelength-converting material above the optoelectronic semiconductor chip. The wavelength-converting material may be arranged in a simple manner in the cavity formed in the housing.

After dissolving away the sacrificial layer, a further step may be carried out to arrange a potting material in a free space produced as a result of dissolving away the sacrificial layer. The potting material may afford protection of the optoelectronic semiconductor chip of the optoelectronic component obtainable by the method against damage as a result of external influences. Moreover, the potting material may serve as a reflector. In this case, the potting material may be chosen such that it comprises a high aging stability.

After dissolving away the sacrificial layer and removing the substrate, further steps may be carried out to arrange a potting material in a free space produced as a result of dissolving away the sacrificial layer and removing the substrate, and arrange a wavelength-converting material above the potting material. Advantageously, this method enables simple production of an optoelectronic component comprising a wavelength-converting material spaced apart from the optoelectronic semiconductor chip. One advantage of the optoelectronic component obtainable by this method is that a uniform color impression of the light emitted in a varying spatial direction may be achieved as a result of the spaced-apart arrangement of the wavelength-converting material.

Before arranging the optoelectronic semiconductor chip on the auxiliary carrier, a further step may be carried out to galvanically deposit internal electrical contact pads at the electrical contact locations of the optoelectronic semiconductor chip. The internal electrical contact pads may form electrically conductive connections during the further processing, which electrically conductive connections extend through the housing of the optoelectronic component obtainable by this method and thereby enable an electrical contacting of the optoelectronic semiconductor chip of the optoelectronic component obtainable by the method.

Depositing the internal electrical contact pads may be carried out before arranging the optoelectronic semiconductor chip on the temporary carrier. Afterward, the internal electrical contact pads are embedded into the temporary carrier such that the layer sequence is in contact with the temporary carrier. What is achieved as a result is that the contact side of the layer sequence of the optoelectronic semiconductor chip remains free of the material of the sacrificial layer and thus later bears against the molding material of the housing, as a result of which the housing of the optoelectronic component obtainable by this method carries the optoelectronic semiconductor chip.

After arranging the molding material, further steps may be carried out to remove a part of the molding material to expose the internal electrical contact pads, and arrange external electrical contact pads electrically conductively connected to the internal contact pads at an exterior side of the housing. Advantageously, the external electrical contact pads of the optoelectronic component obtainable by this method enable an electrical contacting of the optoelectronic semiconductor chip via the internal contact pads and the contact locations of the optoelectronic semiconductor chip. The optoelectronic component obtainable by the method may be suitable, for example, as an SMD component for surface mounting, for example, for surface mounting by reflow soldering.

The optoelectronic semiconductor chip may be arranged together with a plurality of further optoelectronic semiconductor chips on the auxiliary carrier. In this example, a housing assemblage comprising a plurality of housings is formed from the molding material. The housing assemblage is subsequently divided to singulate the housing. The method is thereby suitable for parallel production of a plurality of optoelectronic components in common processing steps. As a result, the time required for production of an optoelectronic component and the production costs per optoelectronic component may advantageously be significantly reduced.

My optoelectronic component comprises a housing comprising a cavity. In this case, a layer sequence of an optoelectronic semiconductor chip is arranged at a bottom of the cavity. Advantageously, the housing of this optoelectronic component serves as a carrier for the layer sequence, as a result of which the optoelectronic component does not require a further carrier for the layer sequence. This makes it possible to form the optoelectronic component with very compact external dimensions. As a result of the arrangement of the layer sequence at the bottom of the cavity of the housing, the cavity enables gathering and focusing of electromagnetic radiation emitted by the layer sequence of the optoelectronic component.

The layer sequence may not be connected to a growth substrate. This is made possible by virtue of the fact that the layer sequence at the bottom of the cavity is carried by the material of the housing of the optoelectronic component.

The layer sequence may at least be partly embedded into the material of the housing. Advantageously, the layer sequence in this optoelectronic component, as a result of the partial embedding into the material of the housing, is protected particularly effectively against damage as a result of external influences. Further advantages of this optoelectronic component are that it may be produced in a simple manner without using a sacrificial layer and may comprise particularly compact external dimensions.

A wavelength-converting material may be arranged in the cavity. The wavelength-converting material may convert at least part of an electromagnetic radiation emitted by the layer sequence of the optoelectronic component into electromagnetic radiation of a different wavelength.

External electrical contact pads may be arranged at a rear side of the housing situated opposite the cavity. In this case, the external electrical contact pads are integrally continuously connected to electrical contact locations of the optoelectronic semiconductor chip via electrically conductive connections. The electrically conductive connections extend through a base region of the housing. Advantageously, the external electrical contact pads thereby enable an electrical contacting of the layer sequence of the optoelectronic component. In this case, advantageously, it is not necessary for the layer sequence to be electrically contacted by producing a bond wire connection, a soldering connection or an electrically conductive adhesive-bonding connection.

The above-described properties, features and advantages and the way in which they are achieved will become clearer and more clearly understood in association with the following description of examples explained in greater detail in association with the drawings.

FIG. 1 shows a schematic sectional side view of two optoelectronic semiconductor chips 100. The optoelectronic semiconductor chips 100 are situated in a wafer assemblage with further optoelectronic semiconductor chips 100, which are not shown in the schematic illustration in FIG. 1. The optoelectronic semiconductor chips 100 are configured to emit electromagnetic radiation, for example, visible light. The optoelectronic semiconductor chips 100 may be formed, for example, as light emitting diode chips (LED chips).

The wafer assemblage of the optoelectronic semiconductor chips 100 comprises a substrate 110 and a layer sequence 120. The substrate 110 may also be referred to as a growth substrate. The substrate 110 may comprise sapphire, for example. The layer sequence 120 comprises semiconductor layers, which may have been grown, for example, epitaxially onto the substrate 110. The layer sequence 120 comprises an active region, in which electromagnetic radiation is generated during operation of the optoelectronic semiconductor chips 100. The layer sequence 120 may be based on GaN, for example. The layer sequence 120 may comprise further layers, for example, metallic layers alongside epitaxially grown semiconductor layers.

Each of the optoelectronic semiconductor chips 100 comprises a contact side 101, which is formed by that side of the layer sequence 120 facing away from the substrate 110. At its contact side 101, each optoelectronic semiconductor chip 100 comprises at least two electrical contact locations 130, which enable electrical contacting of the optoelectronic semiconductor chip 100.

Figure 2:
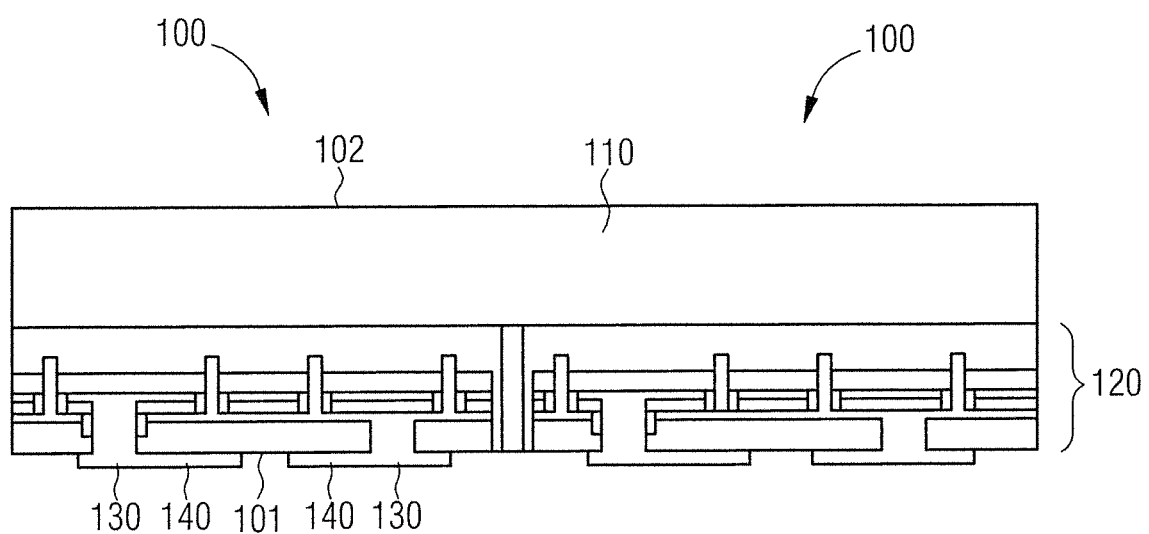
FIG. 2 schematically shows a sectional side view of the optoelectronic semiconductor chip with seed layers arranged at electrical contact locations.

FIG. 2 shows a schematic sectional side view of the optoelectronic semiconductor chips 100 in a processing state temporally succeeding the illustration in FIG. 1.

At the contact sides 101 of the optoelectronic semiconductor chips 100, seed layers 140 have been arranged above the electrical contact locations 130. The seed layers 140 may also be referred to as seed layer.

FIG. 3 shows a schematic sectional side view of the optoelectronic semiconductor chips 100 in a processing state temporally succeeding the illustration in FIG. 2.

At the contact sides 101 of the optoelectronic semiconductor chips 100, internal electrical contact pads 150 have been formed above the seed layers 140 arranged above the electrical contact locations 130. The internal electrical contact pads 150 electrically conductively connect to the electrical contact locations 130 of the optoelectronic semiconductor chips 100 and may subsequently serve for the electrical contacting of the optoelectronic semiconductor chips 100. The internal electrical contact pads 150 integrally continuously connect to the electrical contact locations 130 of the optoelectronic semiconductor chips 100 via the seed layers 140.

The internal electrical contact pads 150 may have been created, for example, by galvanic thickening of the seed layers 140.

Figure 6:
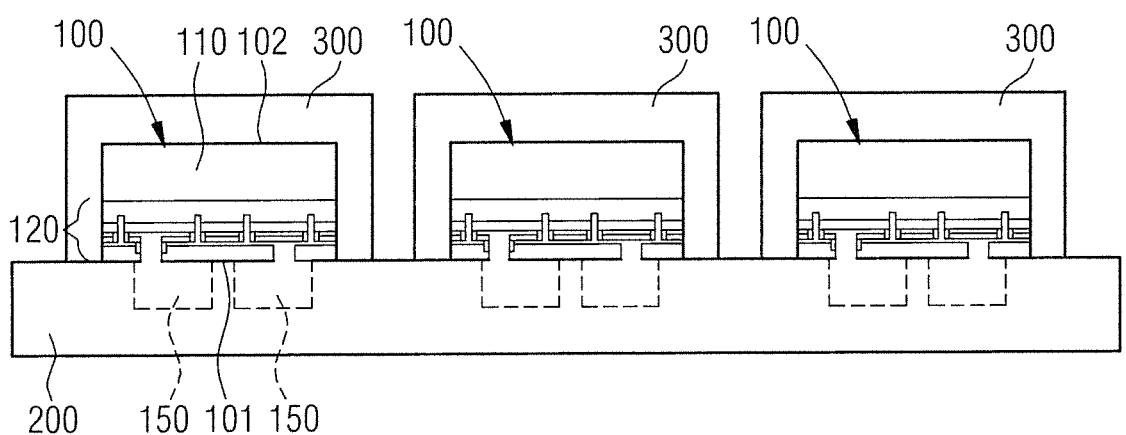
FIG. 6 schematically shows a sectional side view of the temporary carrier after embedding the optoelectronic semiconductor chips into a sacrificial layer.
Figure 7:
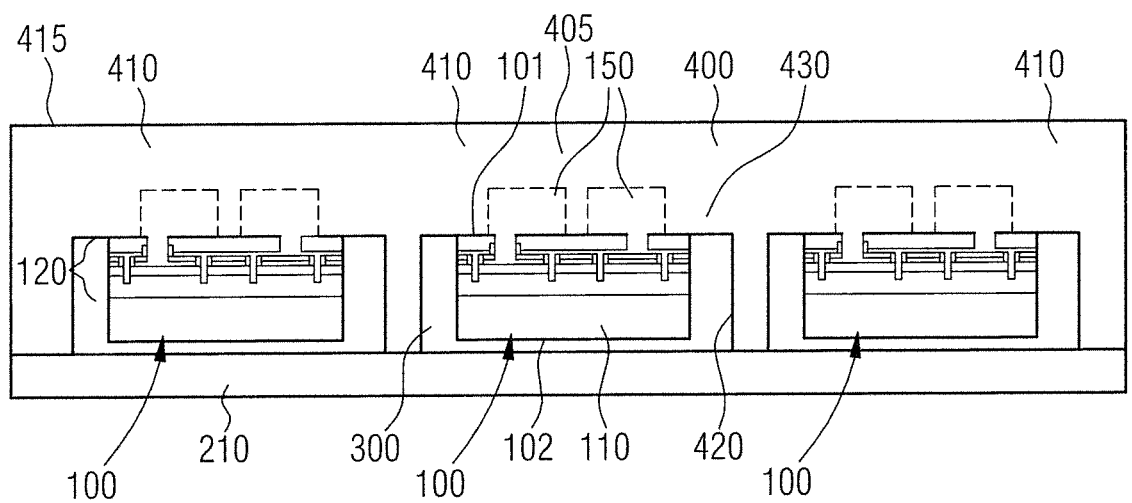
FIG. 7 schematically shows a sectional side view of an auxiliary carrier with a housing assemblage formed thereabove, into which the optoelectronic semiconductor chips embedded into the sacrificial layer are embedded.

It is possible to create the internal electrical contact pads 150 not as early as after the processing state of the optoelectronic semiconductor chips 100 shown in FIG. 2, but rather not until during a processing step that is carried out between the processing states of the optoelectronic semiconductor chips 100 shown in FIGS. 6 and 7.

FIG. 4 shows a schematic sectional side view of the optoelectronic semiconductor chips 100 in a processing state temporally succeeding the illustration in FIG. 3.

The optoelectronic semiconductor chips 100 have been singulated by dividing the wafer assemblage. Each of the optoelectronic semiconductor chips 100 comprises a part of the substrate 110 and a part of the layer sequence 120 arranged on the substrate 110.

Figure 5:
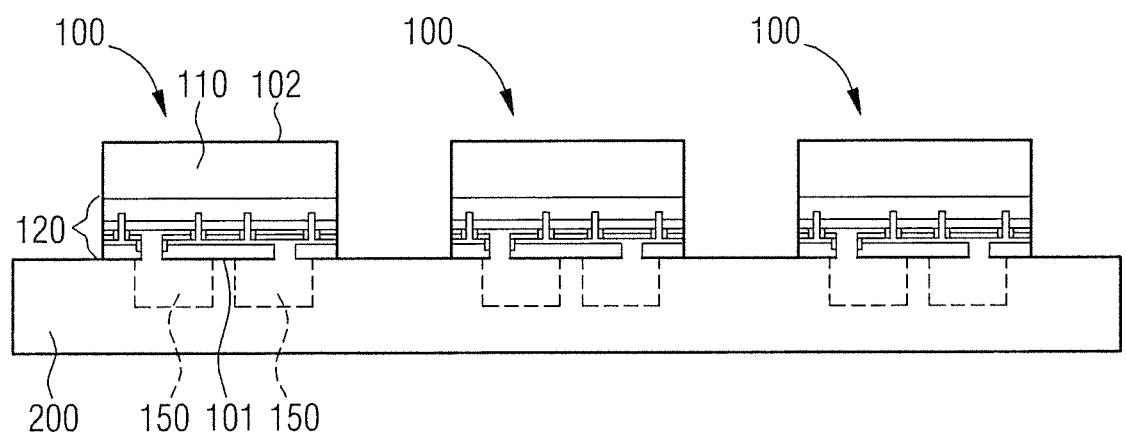
FIG. 5 schematically shows a schematic sectional side view of a temporary carrier with optoelectronic semiconductor chips arranged thereon.

FIG. 5 shows a schematic sectional side view of a temporary carrier 200.

A plurality of the optoelectronic semiconductor chips 100 singulated in the preceding processing step have been arranged at a top side of the temporary carrier 200. Only three of the optoelectronic semiconductor chips 100 are illustrated in FIG. 5. At the top side of the temporary carrier 200, however, a larger number of optoelectronic semiconductor chips 100 may be arranged in a two-dimensional matrix arrangement. Arranging the optoelectronic semiconductor chips 100 on the temporary carrier 200 may have been carried out, for example, by a pick-and-place method.

The optoelectronic semiconductor chips 100 are arranged at the top side of the temporary carrier 200 such that the contact sides 101 of the optoelectronic semiconductor chips 100 face the temporary carrier 200 and are in contact with the temporary carrier 200.

If the internal electrical contact pads 150 have already been created at the contact sides 101 of the optoelectronic semiconductor chips 100, then they are pressed into the temporary carrier 200, which in this case is expediently formed in a compliant fashion such that the internal electrical contact pads 150 are embedded into the material of the temporary carrier 200 and the remaining sections of the contact sides 101 of the optoelectronic semiconductor chips 100 are in contact with the top side of the temporary carrier 200.

FIG. 6 shows a schematic sectional side view of the temporary carrier 200 and the optoelectronic semiconductor chips 100 arranged on the temporary carrier 200 in a processing state temporally succeeding the illustration in FIG. 5.

A sacrificial layer 300 has been arranged above the temporary carrier 200. In this case, the optoelectronic semiconductor chips 100 have been embedded into the sacrificial layer 300. Each optoelectronic semiconductor chip 100 is embedded into a dedicated, separate section of the sacrificial layer 300. For this purpose, the sacrificial layer 300 may, for example, initially have been arranged areally above the temporary carrier 200 to cover all the optoelectronic semiconductor chips 100. Afterward, the sacrificial layer 300 may have been structured and subdivided into the individual sections each embedding an optoelectronic semiconductor chip 100. Structuring and subdividing the sacrificial layer 300 may have been carried out, for example, by a sawing process.

In each optoelectronic semiconductor chip 100, the sections of the sacrificial layer 300 respectively cover a rear side 102 of the substrate 110 of the optoelectronic semiconductor chip 100, the rear side facing away from the layer sequence 120, and side faces of the optoelectronic semiconductor chip 100 that extend from the rear side 102 to the contact side 101. By contrast, the contact sides 101 of the optoelectronic semiconductor chips 100, the contact sides being in contact with the temporary carrier 200, are each not covered by the sacrificial layer 300.

The sacrificial layer 300 comprises a material which may be dissolved using a solvent or in some other way. By way of example, the sacrificial layer 300 may comprise a photoresist.

The sections of the sacrificial layer 300 may alternatively also have been preproduced and arranged above the individual optoelectronic semiconductor chips 100 above the temporary carrier 200.

In the example illustrated schematically in FIG. 6, the sections of the sacrificial layer 300 in each case comprise a parallelepipedal outer contour at their outer sides. It is possible to form the sections of the sacrificial layer 300 with a different outer contour. By way of example, the sections of the sacrificial layer 300 might comprise in each case the shape of a paraboloid of revolution at their outer sides.

In a processing step succeeding the processing state shown in FIG. 6, the optoelectronic semiconductor chips 100 with the sections of the sacrificial layer 300 that surround them are detached from the temporary carrier 200. The contact sides 101 are exposed in the process. If the internal electrical contact pads 150 had not already been created during the method step explained with reference to FIG. 3, then creating the internal electrical contact pads 150 may now be carried out.

FIG. 7 shows a schematic sectional side view of an auxiliary carrier 210. The optoelectronic semiconductor chips 100 detached from the temporary carrier 200 have been arranged with the sections of the sacrificial layer 300 embedding them at a top side of the auxiliary carrier 210. In this case, the optoelectronic semiconductor chips 100 have been arranged such that the contact sides 101 of the optoelectronic semiconductor chips 100 face away from the auxiliary carrier 210.

Afterward, a molding material 400 has been arranged above the top side of the auxiliary carrier 210. In this case, the optoelectronic semiconductor chips 100 arranged at the top side of the auxiliary carrier 210 have been at least partly enclosed by the molding material 400 and embedded into the molding material 400. Arranging the molding material 400 may have been carried out by a molding method (mold method), for example.

The molding material 400 covers the contact sides 101 of the optoelectronic semiconductor chips 100 facing away from the auxiliary carrier 210. The internal electrical contact pads 150 arranged at the contact sides 101 of the optoelectronic semiconductor chips 100 have been embedded into the molding material 400.

The molding material 400 may be, for example, a plastics material in particular, for example, an epoxy resin.

The molding material 400 arranged above the top side of the auxiliary carrier 210 forms a housing assemblage 415 comprising a plurality of housings 410. The housing assemblage 415 comprises one housing 410 per optoelectronic semiconductor chip 100, the housing at least partly enclosing the respective optoelectronic semiconductor chip 100. The individual housings 410 are continuously connected to one another in the housing assemblage 415.

Figure 8:
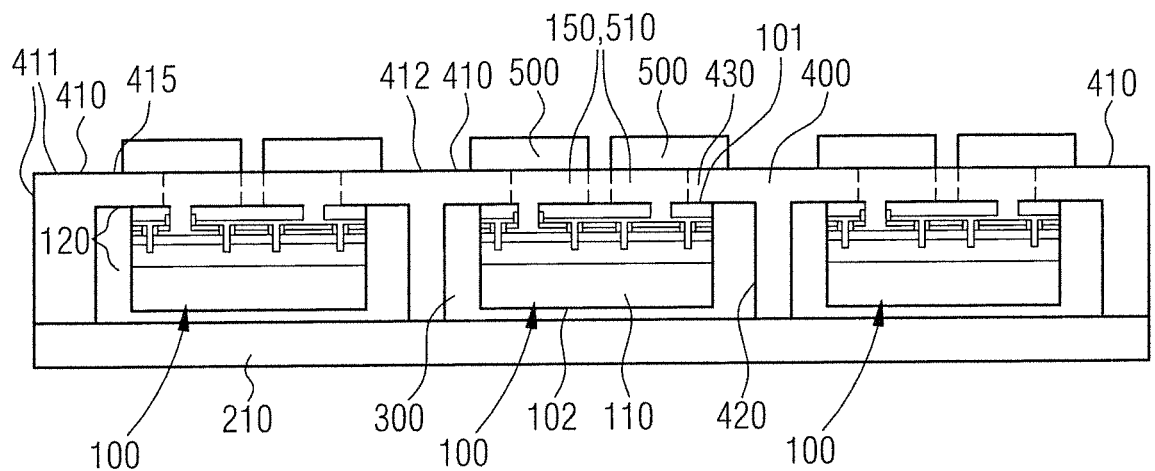
FIG. 8 schematically shows a sectional side view of the housing assemblage after creating external electrical contact pads.

FIG. 8 shows a schematic sectional side view of the auxiliary carrier 210 and the housing assemblage 415 with the optoelectronic semiconductor chips 100 embedded therein, the housing assemblage being arranged above the top side of the auxiliary carrier 210, in a processing state temporally succeeding the illustration in FIG. 7.

Proceeding from the processing state shown in FIG. 7, a part 405 of the molding material 400, the part being arranged above the contact sides 101 of the optoelectronic semiconductor chips 100 and the internal electrical contact pads 150 of the optoelectronic semiconductor chips 100, has been removed to expose the internal electrical contact pads 150 of the optoelectronic semiconductor chips 100. Removing the part 405 of the molding material 400 may have been carried out by a grinding process, for example.

A section of the molding material 400 that has remained after removing the part 405 of the molding material 400 above the contact sides 101 of the optoelectronic semiconductor chips 100 now forms base regions 430 of the housings 410 of the housing assemblage 415, the housings being formed by the molding material 400. The exposed internal electrical contact pads 150 form electrically conductive connections 510 extending from the electrical contact locations 130 of the optoelectronic semiconductor chips 100 through the base regions 430 of the housings 410 to rear sides 412 of the housings 410, the rear sides facing away from the top side of the auxiliary carrier 210.

It is possible, as early as during the process of arranging the molding material 400, to arrange the molding material 400 above the top side of the auxiliary carrier 210 such that the contact sides 101 of the optoelectronic semiconductor chips 100 are indeed covered by the molding material 400, but the internal electrical contact pads 150 arranged at the contact sides 101 of the optoelectronic semiconductor chips 100 remain accessible. In this case, removing the part 405 of the molding material 400 may be dispensed with.

After exposing the internal electrical contact pads 150 of the optoelectronic semiconductor chips 100, external electrical contact pads 500 have been arranged at the rear sides 412 of the housings 410 of the housing assemblage 415, the external electrical contact pads being electrically conductively connected to the electrically conductive connections 510 formed by the internal electrical contact pads 150 and, as a result, also to the electrical contact locations 130 of the optoelectronic semiconductor chips 100. The external electrical contact pads 500 may have been created by a photolithographic method, for example.

The external electrical contact pads 500 integrally continuously connect to the electrical contact locations 130 of the optoelectronic semiconductor chips 100 via the electrically conductive connections 510 formed by the internal electrical contact pads 150. This means that there are no soldering or adhesive-bonding connections between the electrical contact locations 130 of the optoelectronic semiconductor chips 100 and the external electrical contact pads 500.

In processing steps succeeding the illustration in FIG. 8, the individual housings 410 are singulated by dividing the housing assemblage 415 and detached from the auxiliary carrier 210. Detaching the housings 410 from the auxiliary carrier 210 may be carried out before or after dividing the housing assemblage 415. Dividing the housing assemblage 415 may be carried out by a sawing method, for example.

FIG. 9 shows a schematic sectional side view of one of the housings 410 in a processing state succeeding the singulation of the housing 410 and the detachment from the auxiliary carrier 210.

After detaching the housing 410 from the top side of the auxiliary carrier 210, the section of the sacrificial layer 300 previously bearing against the top side of the auxiliary carrier 210 was accessible. The section of the sacrificial layer 300 was then dissolved away, for example, using a solvent.

Those parts of the molding material 400 forming the housing 410 which previously at least partly enclose the section of the sacrificial layer 300 form a cavity 420 of the housing 410. By dissolving away the sacrificial layer 300, a free space 305 has been formed in the cavity 420 of the housing 410.

The optoelectronic semiconductor chip 100 previously embedded into the section of the sacrificial layer 300 is arranged in the cavity 420 of the housing 410. In this case, the optoelectronic semiconductor chip 100 is arranged at a bottom 425 of the cavity 420 such that the contact side 101 of the layer sequence 120 of the optoelectronic semiconductor chip 100 faces the bottom 425 of the cavity 420 and is in contact with the bottom 425 of the cavity 420. The base region 430 of the housing 410, the base region being adjacent to the bottom 425 of the cavity 420, carries the optoelectronic semiconductor chip 100.

The housing 410 with the optoelectronic semiconductor chip 100 arranged in the cavity 420 shown in FIG. 9 forms a first example of an optoelectronic component 10. The optoelectronic component 10 may be electrically contacted via the external electrical contact pads 500 arranged at the rear side 412 of the housing 410 and may be suitable, for example, as an SMD component for surface mounting in particular, for example, for surface mounting by reflow soldering.

The free space 305 surrounding the optoelectronic semiconductor chip 100 arranged in the cavity 420, the free space having been produced as a result of dissolving away the sacrificial layer 300, may be filled with a potting material, for example, with a light reflecting potting material. The potting material may comprise, for example, embedded reflective particles, for example, particles comprising $TiO_2$.

Figure 11:
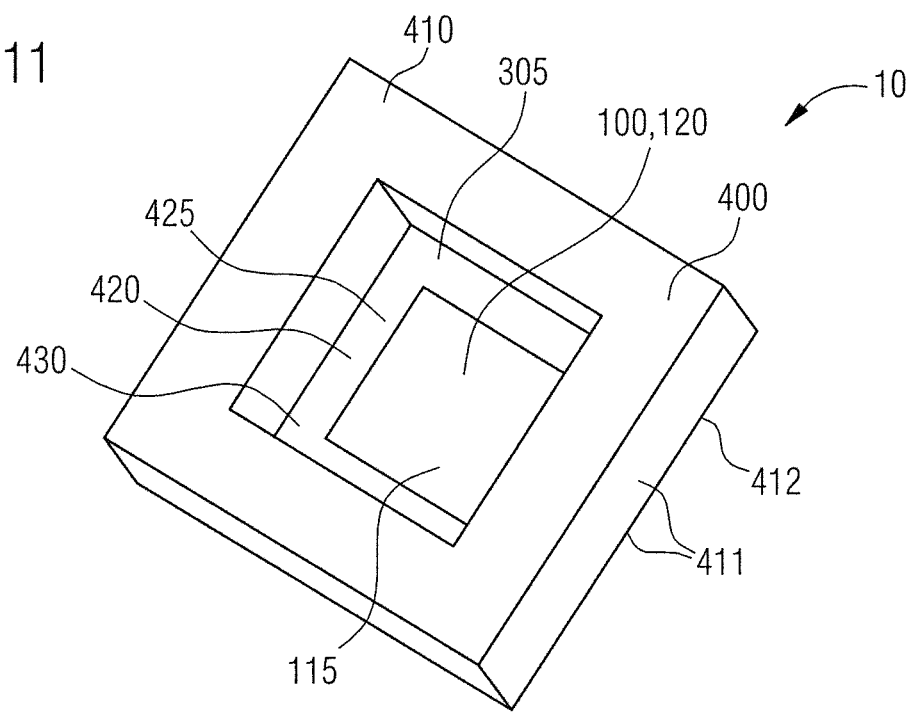
FIG. 11 schematically shows a first perspective illustration of the optoelectronic component of the second example.
Figure 12:
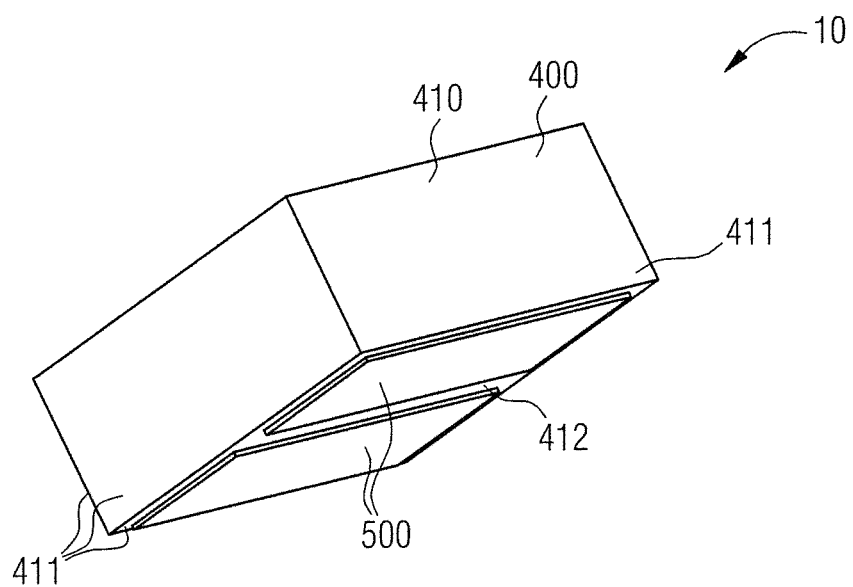
FIG. 12 schematically shows a second perspective illustration of the optoelectronic component of the second example.

FIG. 10 shows a schematic sectional side view of a second example of the optoelectronic component 10. The second example of the optoelectronic component 10 may be produced by further processing from the first example of the optoelectronic component 10 shown in FIG. 9. FIG. 11 shows a first schematic perspective illustration of the second example of the optoelectronic component 10 in a view from above. FIG. 12 shows a second schematic perspective illustration of the second example of the optoelectronic component 10 in a view from below.

Proceeding from the illustration in FIG. 9, the substrate 110 of the optoelectronic semiconductor chip 100 was removed. In this case, the layer sequence 120 of the optoelectronic semiconductor chip 100 remained at the molding material 400 at the bottom 425 of the cavity 420 of the housing 410. The molding material 400 of the housing 410 carries the layer sequence 120 of the optoelectronic semiconductor chip 100 that remained.

Removing the substrate 110 of the optoelectronic semiconductor chip 100 may have been carried out by a laser detaching process (laser lift-off), for example.

Figure 13:
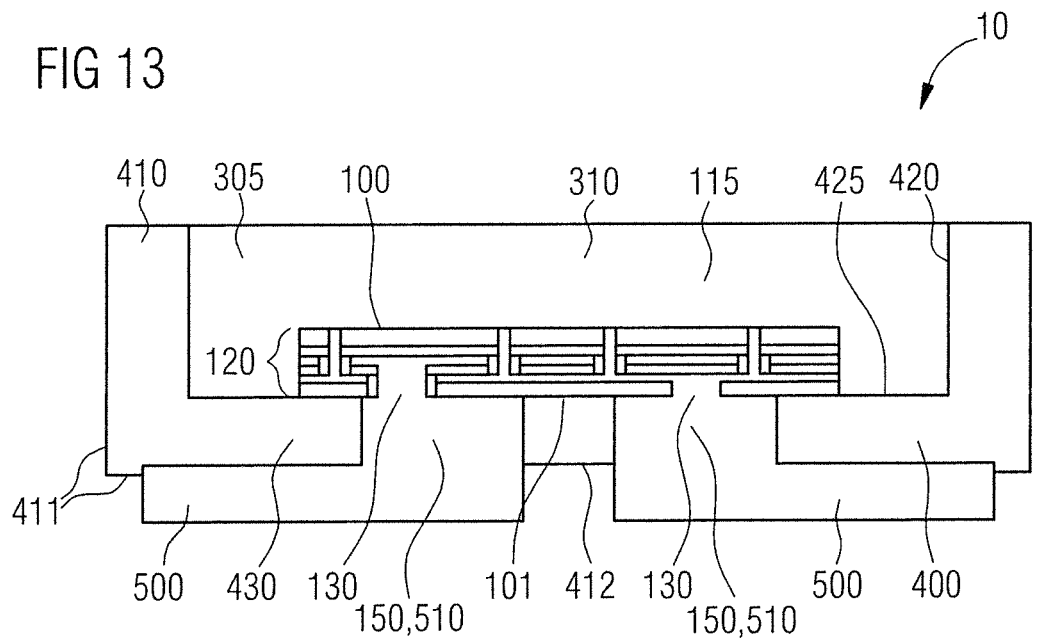
FIG. 13 schematically shows a sectional side view of an optoelectronic component in accordance with a third example.

FIG. 13 shows a schematic sectional side view of a third example of the optoelectronic component 10. The third example of the optoelectronic component 10 may be produced by further processing from the second example of the optoelectronic component 10 as shown in FIGS. 10 to 12.

Proceeding from the processing state shown in FIG. 10, to produce the third example of the optoelectronic component 10, a wavelength-converting material 310 has been arranged in the cavity 420 of the housing 410. The wavelength-converting material 310 fills at least part of the free space 305 produced as a result of removing the sacrificial layer 300 in the cavity 420 and part of a free space 115 produced as a result of removing the substrate 110 in the cavity 420. The layer sequence 120 of the optoelectronic semiconductor chip 100 arranged in the cavity 420 has been at least partly embedded into the wavelength-converting material 310.

The wavelength-converting material 310 is configured to convert at least part of an electromagnetic radiation generated by the optoelectronic semiconductor chip 100 of the optoelectronic component 10 into electromagnetic radiation of a different wavelength. For this purpose, the wavelength-converting material 310 may comprise, for example, embedded wavelength-converting particles.

Figure 14:
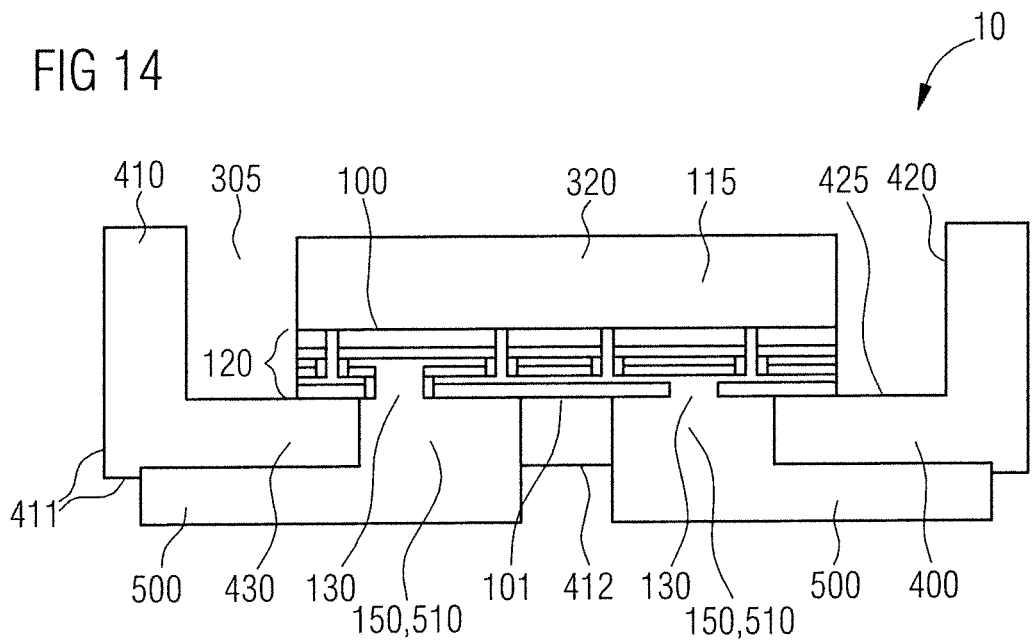
FIG. 14 schematically shows a sectional side view of an optoelectronic component in accordance with a fourth example.

FIG. 14 shows a schematic sectional side view of a fourth example of the optoelectronic component 10. The fourth example of the optoelectronic component 10 may be produced by further processing from the second example of the optoelectronic component 10 as illustrated in FIGS. 10 to 12.

Proceeding from the processing state shown in FIG. 10, to produce the fourth example of the optoelectronic component 10, a wavelength-converting element 320 has been arranged on the layer sequence 120 of the optoelectronic semiconductor chip 100. The wavelength-converting element 320 may comprise, for example, the form of a preproduced lamina. The wavelength-converting element 320 fills at least part of the free space 115 formed by removal of the substrate 110, but substantially does not extend into the free space 305 formed as a result of removing the sacrificial layer 300.

The wavelength-converting element 320 is configured to convert at least part of an electromagnetic radiation generated by the optoelectronic semiconductor chip 100 of the optoelectronic component 10 into electromagnetic radiation of a different wavelength. For this purpose, the wavelength-converting element 320 may comprise, for example, embedded wavelength-converting particles.

Figure 15:
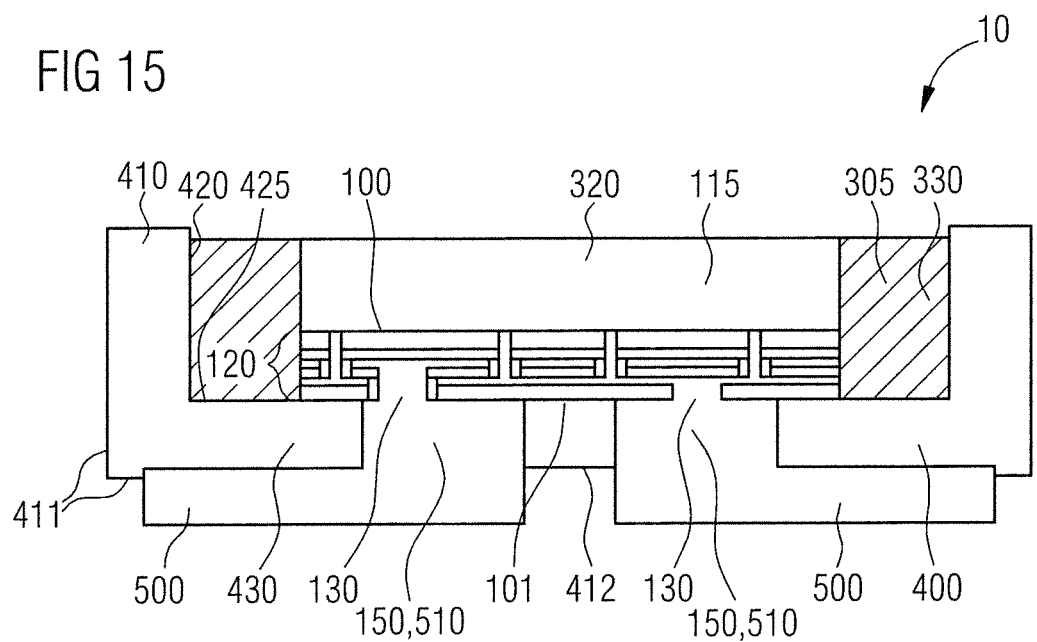
FIG. 15 schematically shows a sectional side view of an optoelectronic component in accordance with a fifth example.

FIG. 15 shows a schematic sectional side view of a fifth example of the optoelectronic component 10. The fifth example of the optoelectronic component 10 may be produced by further processing from the fourth example of the optoelectronic component 10 as shown in FIG. 14.

Proceeding from the processing state shown in FIG. 14, to produce the fifth example of the optoelectronic component 10, a potting material 330 was arranged in the free space 305 produced as a result of removing the sacrificial layer 300 in the cavity 420. The potting material 330 at least partly encloses the layer sequence 120 of the optoelectronic semiconductor chip 100 arranged in the cavity 420 of the housing 410 and the wavelength-converting element 320 arranged on the layer sequence 120 in the cavity 420.

The potting material 330 may be configured such that it is light reflecting. The potting material 330 may comprise, for example, embedded light reflecting particles, for example, particles comprising $TiO_2$.

Figure 16:
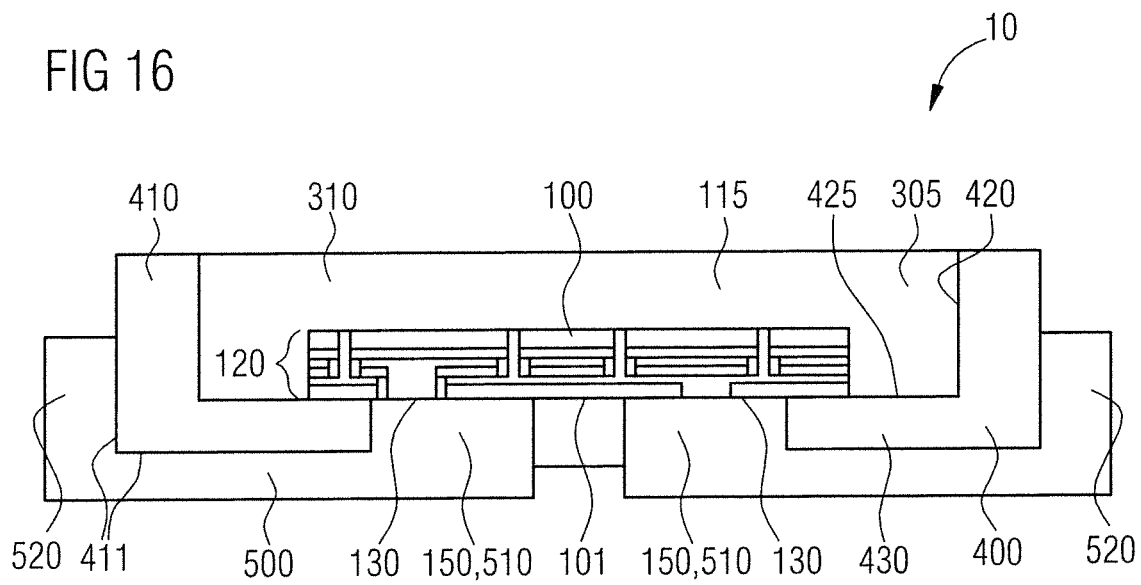
FIG. 16 schematically shows a sectional side view of an optoelectronic component in accordance with a sixth example.
Figure 17:
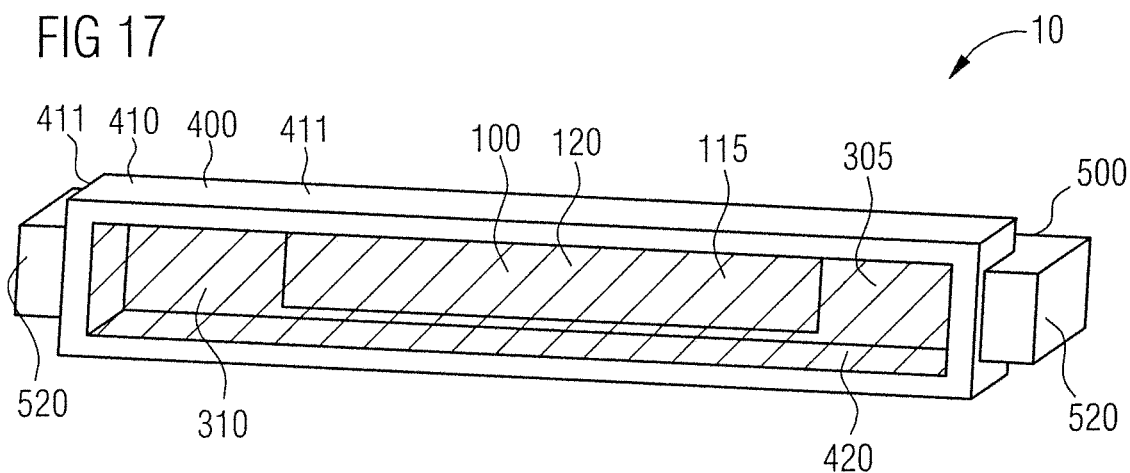
FIG. 17 schematically shows a perspective illustration of the optoelectronic component of the sixth example.
Figure 18:
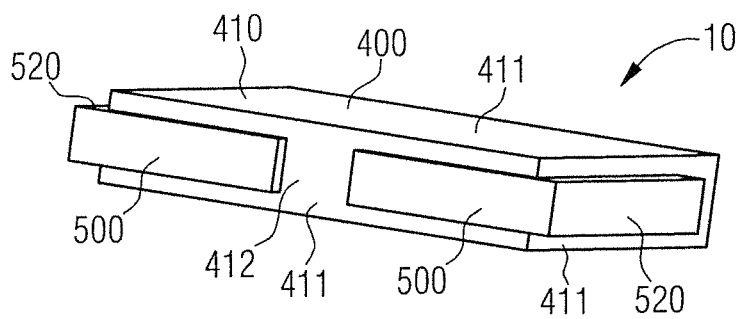
FIG. 18 schematically shows a further perspective illustration of the optoelectronic component of the sixth example.

FIG. 16 shows a schematic sectional side view of a sixth example of the optoelectronic component 10. FIG. 17 shows a schematic perspective illustration of the sixth example of the optoelectronic component 10 in a view from above. FIG. 18 shows a schematic perspective illustration of the sixth example of the optoelectronic component 10 in a view from below.

The sixth example of the optoelectronic component 10 largely corresponds to the third example of the optoelectronic component 10 as shown in FIG. 13 and may be produced by the same method as the third example of the optoelectronic component 10, provided that the differences described below are taken into account.

The sixth example of the optoelectronic component 10 differs from the third example of the optoelectronic component 10 in that in addition to the external electrical contact pads 500 at the rear side 412 of the housing 410 lateral electrical contact pads 520 are also present. The lateral contact pads 520 are arranged at two exterior sides 411 of the housing 410 which are situated opposite one another and which are oriented perpendicularly to the rear side 412 of the housing 410. Each lateral electrical contact pad 520 electrically conductively connects to one of the external electrical contact pads 500. As a result, the lateral electrical contact pads 520 may serve as an alternative to the external electrical contact pads 500 for the electrical contacting of the optoelectronic component 10. The lateral electrical contact pads 520 are suitable, for example, to contact the optoelectronic component 10 in a sidelooker arrangement.

The lateral electrical contact pads 520 may be produced jointly with the external electrical contact pads 500 or in a further processing step succeeding the production of the external electrical contact pads 500. In any case, the lateral electrical contact pads 520 are created after dividing the housing assemblage 415. In this case, the lateral electrical contact pads 520 may be created before or after detaching the individual housings 410 from the auxiliary carrier 210. The lateral electrical contact pads 520 may be applied by sputtering, for example.

Figure 19:
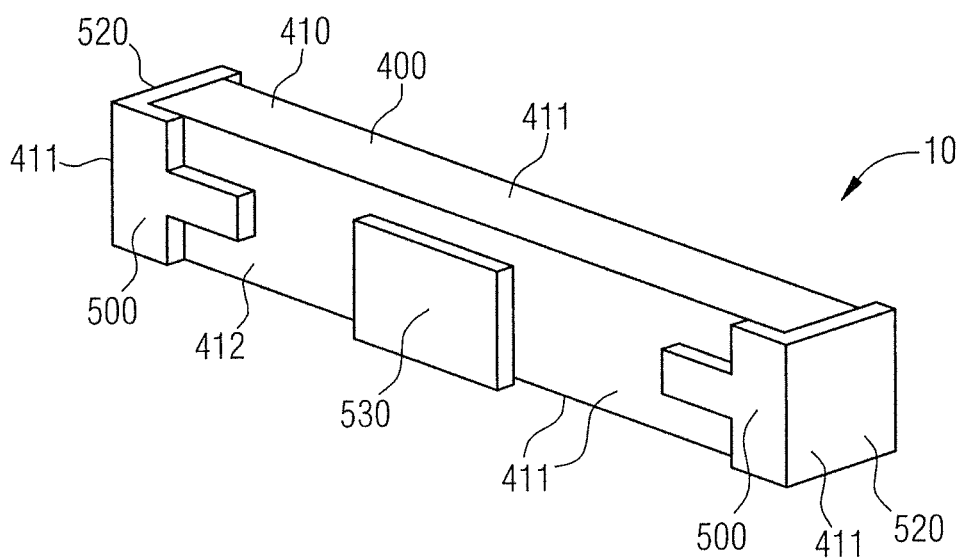
FIG. 19 schematically shows a perspective illustration of an optoelectronic component in accordance with a seventh example.

FIG. 19 shows a schematic perspective illustration of a seventh example of the optoelectronic component 10 in a view from below. The seventh example of the optoelectronic component 10 largely corresponds to the sixth example of the optoelectronic component 10 as described with reference to FIGS. 16 to 18. The seventh example of the optoelectronic component 10 may be produced by the same method as the sixth example of the optoelectronic component 10, provided that the deviations described below are taken into account.

The seventh example of the optoelectronic component 10 differs from the sixth example of the optoelectronic component 10 in that in addition to the external electrical contact pads 500 arranged at the rear side 412 of the housing 410 and the lateral electrical contact pads 520 arranged at further exterior sides 411 of the housing 410 a thermal contact pad 530 is arranged at the rear side 412 of the housing 410. The thermal contact pad 530 does not serve for the electrical contacting of the optoelectronic semiconductor chip 100 of the optoelectronic component 10, but rather only for the thermal linking of the optoelectronic semiconductor chip 100 of the optoelectronic component 10. The thermal contact pad 530 enables particularly effective dissipation of waste heat arising in the optoelectronic semiconductor chip 100 during operation of the optoelectronic component 10.

During production of the seventh example of the optoelectronic component 10, as early as before the processing state shown in FIG. 2, a further seed layer may be provided at the contact side 101 of the optoelectronic semiconductor chip 100, although it is not electrically conductively connected to the active regions of the optoelectronic semiconductor chip 100. During production of the internal electrical contact pads 150, a further internal contact pad is formed at the further seed layer. Before the processing state shown in FIG. 8, the thermal contact pad 530 is then produced jointly with the external electrical contact pads 500. In this case, the thermal contact pad 530 is positioned such that it is in contact with the further internal contact pad mentioned above.

In a simplified example, it is possible to dispense with providing the further seed layer and the further internal contact pad. In this example, the thermal contact pad 530 is arranged at the rear side 412 of the housing 410 without connecting the rear side to an internal contact pad extending through the base region 430 of the housing 410.

FIG. 20 shows a schematic sectional side view of an eighth example of the optoelectronic component 10 in a still unfinished processing state. The eighth example of the optoelectronic component 10 and a method of producing the eighth example of the optoelectronic component 10 largely correspond to the examples of the optoelectronic component 10 described above and the production method described above. A description is given below merely of how the eighth example of the optoelectronic component 10 and the method of producing the eighth example of the optoelectronic component 10 differ from the examples of the optoelectronic component 10 described above and the method described above.

In the eighth example of the optoelectronic component 10, the substrate 110 of the optoelectronic semiconductor chip 100 may comprise silicon, for example. The layer sequence 120 of the optoelectronic semiconductor chip 100 may be based on GaN, for example. The layer sequence 120 of the singulated optoelectronic semiconductor chip 100, the layer sequence being arranged on the substrate 110, in this example comprises lateral dimensions that are smaller than the lateral dimensions of the substrate 110. This may be caused by sawing trenches, for example.

The process steps described with reference to FIGS. 5 and 6 were omitted in production of the eighth example of the optoelectronic component 10. Consequently, the optoelectronic semiconductor chip 100 has not been embedded into a sacrificial layer 300. Instead, the optoelectronic semiconductor chip 100 in the processing step described with reference to FIG. 7 was arranged on the auxiliary carrier 210 without a surrounding sacrificial layer 300 and embedded directly into the molding material 400.

After detaching the housing 410 of the eighth example of the optoelectronic component 10 from the auxiliary carrier 210 and singulating the housing 410 of the eighth example of the optoelectronic component 10, the rear side 102 of the optoelectronic semiconductor chip 100 facing away from the layer sequence 120 terminates flush with the embedding molding material 400 of the housing 410.

FIG. 21 shows a schematic sectional side view of the eighth example of the optoelectronic component 10 in a processing state temporally succeeding the illustration in FIG. 20.

Proceeding from the processing state shown in FIG. 20, the substrate 110 of the optoelectronic semiconductor chip 100 was removed. Removing the substrate 110 may have been carried out by an etching method, for example. The layer sequence 120 of the optoelectronic semiconductor chip 100 has not been removed and remains at the housing 410 of the eighth example of the optoelectronic component 10. The layer sequence 120 of the optoelectronic semiconductor chip 100 is partly embedded into the molding material 400 of the housing 410 and is carried by the molding material 400 of the housing 410.

As a result of removing the substrate 110 of the optoelectronic semiconductor chip 100, a free space 115 was produced in the housing 410 of the eighth example of the optoelectronic component 10, the free space forming a cavity 420. The size of the cavity 420 of the housing 410 of the eighth example of the optoelectronic component 10 thus corresponds to the size of the formerly present substrate 110 of the optoelectronic semiconductor chip 100.

In optional subsequent processing steps, a wavelength-converting material 310 may be arranged in the cavity 420 of the housing 410 of the optoelectronic component 10 of the eighth example. Alternatively, in the cavity 420 a wavelength-converting element 320 may be arranged on the layer sequence 120 of the optoelectronic semiconductor chip 100. Afterward, the regions of the free space 115 of the cavity 420 that remained may optionally be filled with a potting material 330.

Like the sixth example of the optoelectronic component 10 as described with reference to FIGS. 16 to 18, the eighth example of the optoelectronic component 10 might also be formed with lateral electrical contact pads 520.

Figure 22:
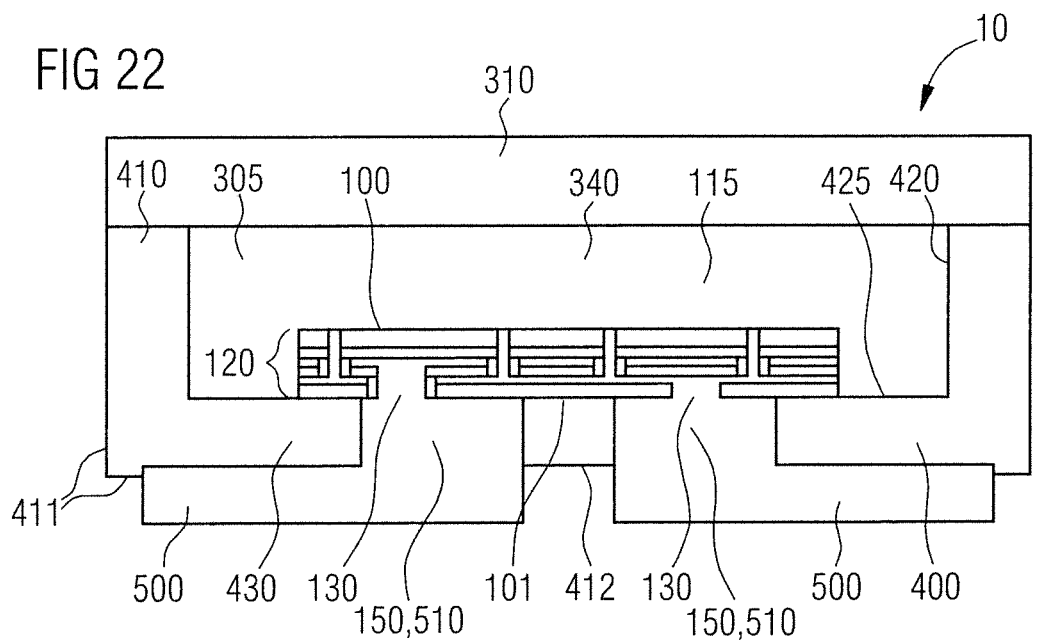
FIG. 22 schematically shows a sectional side view of an optoelectronic component in accordance with a ninth example.

FIG. 22 shows a schematic sectional side view of a ninth example of the optoelectronic component 10. The ninth example of the optoelectronic component 10 may have been produced by further processing from the second example of the optoelectronic component 10 as shown in FIGS. 10 to 12.

Proceeding from the processing state shown in FIG. 10, to produce the ninth example of the optoelectronic component 10, a potting material 340 has been arranged in the cavity 420 of the housing 410. The potting material 340 fills the free space 305 produced as a result of removing the sacrificial layer 300 in the cavity 420 and the free space 115 produced as a result of removing the substrate 110 in the cavity 420. The layer sequence 120 of the optoelectronic semiconductor chip 100 arranged in the cavity 420 has been embedded into the potting material 340. In the example shown in FIG. 22, the potting material 340 completely fills the cavity 420 of the housing 410 of the optoelectronic component 10 and extends as far as the top side of the housing 410. However, it would also be possible to fill the cavity 420 only incompletely with the potting material 340.

The potting material 340 expediently comprises a high transparency for electromagnetic radiation emitted by the optoelectronic semiconductor chip 100. The potting material 340 may comprise a silicone, for example.

In a subsequent processing step, a wavelength-converting material 310 has been arranged above the potting material 340 arranged in the cavity 420. In the example shown in FIG. 22, the wavelength-converting material 310 extends not only over the potting material 340 arranged in the cavity 420 but also over conversion sections delimiting the cavity 420 at the top side of the housing 410 of the optoelectronic component 10. As a result, the wavelength-converting material 310 may have been arranged simultaneously above a plurality of housings 410 of the housing assemblage 415 in a simple manner as early as before dividing the housing assemblage 415. However, the wavelength-converting material 310 might also be restricted to the top side of the potting material 340.

The wavelength-converting material 310 may be configured as in the optoelectronic component 10 of the third example as explained with reference to FIG. 13. The wavelength-converting material 310 is configured to convert at least part of an electromagnetic radiation generated by the optoelectronic semiconductor chip 100 of the optoelectronic component 10 into electromagnetic radiation of a different wavelength. For this purpose, the wavelength-converting material 310 may comprise, for example, embedded wavelength-converting particles.

Like the sixth example of the optoelectronic component 10 as described with reference to FIGS. 16 to 18, the ninth example of the optoelectronic component 10 might also be formed with lateral electrical contact pads 520.

With reference to FIGS. 23 to 26, two further variants of the production method described above with reference to FIGS. 1 to 10 are explained below, which variants may serve for producing a tenth and an eleventh example of the optoelectronic component 10. Only the deviations with respect to the production method described with reference to FIGS. 1 to 10 are presented here. For the rest, the above description of the method also applies to the production of the tenth and eleventh examples of the optoelectronic component 10.

Figure 23:
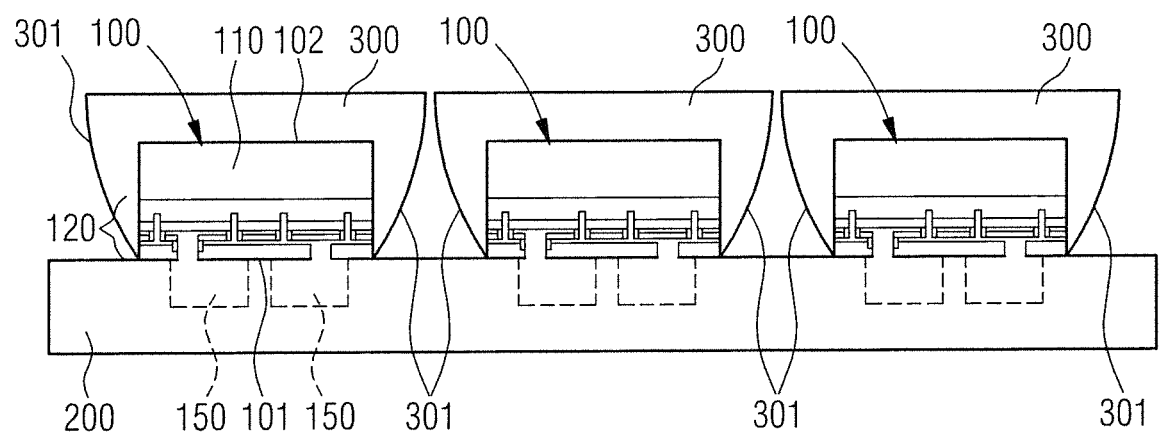
FIG. 23 schematically shows a sectional side view of the temporary carrier after embedding the optoelectronic semiconductor chips into a sacrificial layer by an alternative method.

FIG. 23 shows a schematic sectional side view of the temporary carrier 200 and of the optoelectronic semiconductor chips 100 arranged on the temporary carrier 200 in a processing state temporally succeeding the illustration in FIG. 5.

A sacrificial layer 300 has been arranged above the temporary carrier 200. In this case, the optoelectronic semiconductor chips 100 have been embedded into the sacrificial layer 300. Each optoelectronic semiconductor chip 100 is embedded into a dedicated, separate section of the sacrificial layer 300.

The sacrificial layer has been arranged above the temporary carrier 200 by virtue of the optoelectronic semiconductor chips 100 arranged at the temporary carrier 200 having been immersed upside down in the material of the sacrificial layer 300. In this case, the material of the sacrificial layer 300 was present in liquid form. During immersion of the optoelectronic semiconductor chips 100 in the material of the sacrificial layer 300, the material of the sacrificial layer 300 in each optoelectronic semiconductor chip 100 has respectively wetted the rear side 102 of the substrate 110, the rear side facing away from the layer sequence 120, and the side faces of the optoelectronic semiconductor chip 100 extending from the rear side 102 to the contact side 101. After immersion of the optoelectronic semiconductor chips 100, the material of the sacrificial layer 300 adhering to the rear sides 102 and the side faces of the optoelectronic semiconductor chips 100 has remained at the optoelectronic semiconductor chips 100 and has been cured.

By virtue of the wetting properties and the surface tension of the material of the sacrificial layer 300, a covering by the material of the sacrificial layer 300 has arisen at the side faces of the optoelectronic semiconductor chips 100, the thickness of the covering increasing in a convex manner in each case from the contact sides 101 of the optoelectronic semiconductor chips 100 to the rear sides 102 of the optoelectronic semiconductor chips 100. The parts of the sacrificial layer 300 arranged at the side faces of the optoelectronic semiconductor chips 100 thus form in each case convex sidewalls 301.

Figure 24:
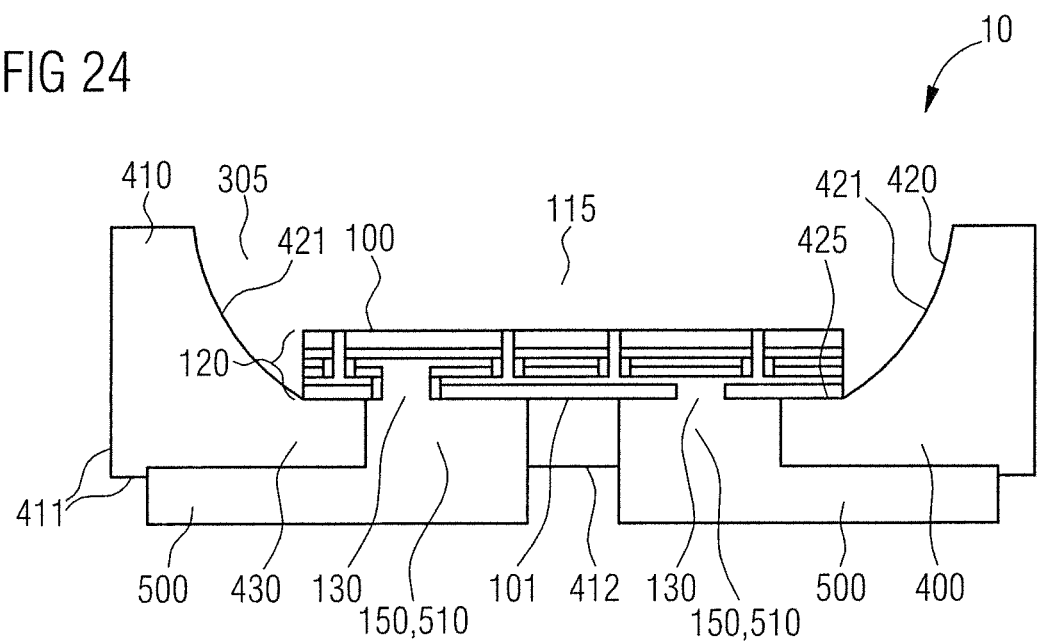
FIG. 24 schematically shows a sectional side view of an optoelectronic component in accordance with a tenth example.

The processing state illustrated in FIG. 23 is succeeded by further processing steps corresponding to the processing steps described with reference to FIGS. 7 to 10. The optoelectronic component 10 of the tenth example shown in a schematically sectional side view in FIG. 24 is obtainable as a result of the processing steps. The optoelectronic component 10 of the tenth example as shown in FIG. 24 corresponds to the optoelectronic component 10 of the second example as shown in FIG. 10, but was produced using the sacrificial layer 300 shown in FIG. 23 and, as a result, by comparison with the second example of the optoelectronic component 10, comprises the deviations also presented below. It goes without saying that, proceeding from the processing state shown in FIG. 23, an optoelectronic component 10 corresponding to one of the examples of the optoelectronic component 10 shown in FIGS. 9, 13, 14, 15, 16 and 22 might also be produced.

As a result of using the sacrificial layer 300 comprising the convex sidewalls 301 during production of the optoelectronic component 10 of the tenth example, the cavity 420 of the housing 410 of the optoelectronic component 10 of the tenth example comprises concave walls 421. The shape of the concave walls 421 of the cavity 420 corresponds to a negative of the shape of the convex sidewalls 301 of the sacrificial layer 300. As a result of the concave walls 421 of the cavity 420, the cavity 420 and the free space 305 formed as a result of removing the sacrificial layer 300 widen from the bottom of the cavity 425 in the direction of the top side of the housing 410 situated opposite the rear side 412.

As a result of the concave walls 421, the cavity 420 of the housing 410 of the optoelectronic component 10 of the tenth example may bring about particularly effective focusing of electromagnetic radiation emitted by the optoelectronic semiconductor chip 100.

Figure 25:
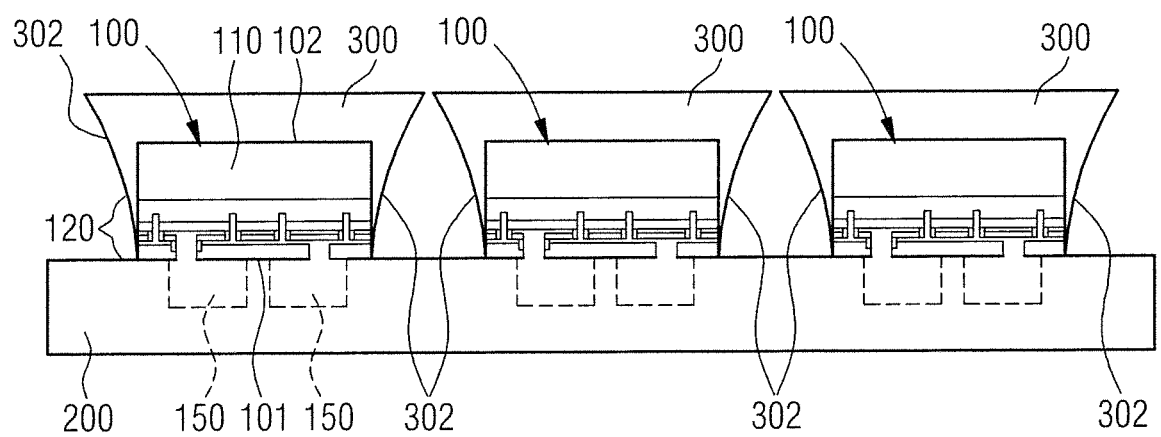
FIG. 25 schematically shows a sectional side view of the temporary carrier after embedding the optoelectronic semiconductor chips into a sacrificial layer according to a further alternative method.

FIG. 25 shows a schematic sectional side view of the temporary carrier 200 and of the optoelectronic semiconductor chips 100 arranged on the temporary carrier 200 in a processing state temporally succeeding the illustration in FIG. 5.

A sacrificial layer 300 has been arranged above the temporary carrier 200. In this case, the optoelectronic semiconductor chips 100 have been embedded into the sacrificial layer 300. Each optoelectronic semiconductor chip 100 is embedded into a dedicated, separate section of the sacrificial layer 300.

The sacrificial layer has been arranged above the temporary carrier 200 by virtue of the optoelectronic semiconductor chips 100 arranged at the temporary carrier 200 having been immersed upside down in the material of the sacrificial layer 300. In this case, the material of the sacrificial layer 300 was present in liquid form. During immersion of the optoelectronic semiconductor chips 100 in the material of the sacrificial layer 300, the material of the sacrificial layer 300 in each optoelectronic semiconductor chip 100 has respectively wetted the rear side 102 of the substrate 110, the rear side facing away from the layer sequence 120, and the side faces of the optoelectronic semiconductor chip 100 extending from the rear side 102 to the contact side 101. After immersion of the optoelectronic semiconductor chips 100, the material of the sacrificial layer 300 adhering to the rear sides 102 and the side faces of the optoelectronic semiconductor chips 100 has remained at the optoelectronic semiconductor chips 100 and has been cured.

By virtue of the wetting properties and the surface tension of the material of the sacrificial layer 300, a covering by the material of the sacrificial layer 300 has arisen at the side faces of the optoelectronic semiconductor chips 100, the thickness of covering increasing in a concave manner in each case from the contact sides 101 of the optoelectronic semiconductor chips 100 to the rear sides 102 of the optoelectronic semiconductor chips 100. The parts of the sacrificial layer 300 arranged at the side faces of the optoelectronic semiconductor chips 100 thus each form concave sidewalls 302.

Figure 26:
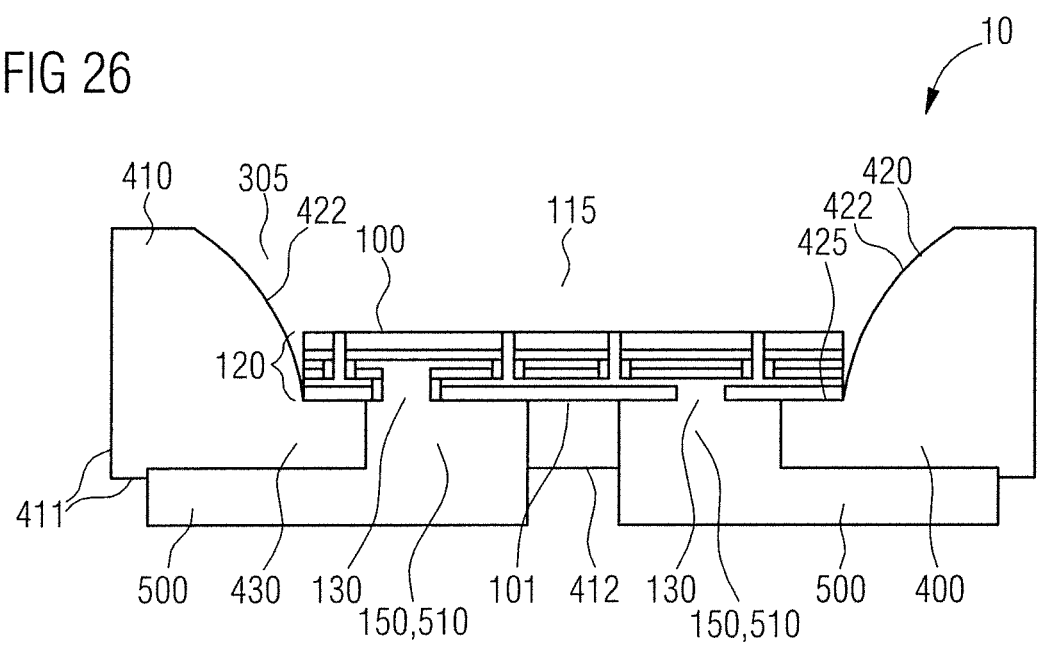
FIG. 26 schematically shows a sectional side view of an optoelectronic component in accordance with an eleventh example.

The processing state illustrated in FIG. 25 is succeeded by further processing steps corresponding to the processing steps described with reference to FIGS. 7 to 10. The optoelectronic component 10 of the eleventh example shown in a schematically sectional side view in FIG. 26 is obtainable as a result of the processing steps. The optoelectronic component 10 of the eleventh example as shown in FIG. 26 corresponds to the optoelectronic component 10 of the second example as shown in FIG. 10, but was produced using the sacrificial layer 300 shown in FIG. 25 and, as a result, by comparison to the second example of the optoelectronic component 10, comprises the deviations also presented below. It goes without saying that, proceeding from the processing state shown in FIG. 25, an optoelectronic component 10 corresponding to one of the examples of the optoelectronic component 10 shown in FIGS. 9, 13, 14, 15, 16 and 22 might also be produced.

As a result of using the sacrificial layer 300 comprising the concave sidewalls 302 during the production of the optoelectronic component 10 of the eleventh example, the cavity 420 of the housing 410 of the optoelectronic component 10 of the eleventh example comprises convex walls 422. The shape of the convex walls 422 of the cavity 420 corresponds to a negative of the shape of the concave sidewalls 302 of the sacrificial layer 300. As a result of the convex walls 422 of the cavity 420, the cavity 420 and the free space 305 formed as a result of removing the sacrificial layer 300 widen from the bottom of the cavity 425 in the direction of the top side of the housing 410 situated opposite the rear side 412.

In all described examples of the optoelectronic component 10 it is possible to metallize the bottom 425 and/or the lateral inner walls of the cavity 420 to achieve an increased optical reflectivity. This may be carried out by a photolithographic method, for example.

My components and methods have been illustrated and described in greater detail on the basis of preferred examples. Nevertheless, this disclosure is not restricted to the examples disclosed. Rather, other variations may be derived therefrom by those skilled in the art, without departing from the scope of protection of the appended claims.

This application claims priority of DE 10 2015 122 641.3, the subject matter of which is incorporated herein by reference.

The invention claimed is:

1. A method of producing an optoelectronic component comprising:
   providing an optoelectronic semiconductor chip comprising a layer sequence arranged on a substrate, wherein the layer sequence comprises a contact side comprising two electrical contact locations, said contact side facing away from the substrate;
   arranging the optoelectronic semiconductor chip on a temporary carrier such that the contact side faces the temporary carrier;
   arranging a sacrificial layer above the temporary carrier such that the optoelectronic semiconductor chip is embedded into the sacrificial layer;
   detaching the optoelectronic semiconductor chip with the surrounding sacrificial layer from the temporary carrier;
   arranging the optoelectronic semiconductor chip with the surrounding sacrificial layer on an auxiliary carrier such that the contact side faces away from the auxiliary carrier;
   arranging a molding material above the auxiliary carrier such that a housing is formed that at least partly encloses the optoelectronic semiconductor chip, wherein the contact side is covered by the molding material;
   detaching the housing from the auxiliary carrier; and
   dissolving away the sacrificial layer.

2. The method according to claim 1, further comprising, after detaching the housing from the auxiliary carrier, removing the substrate, wherein the layer sequence remains at the molding material of the housing.

3. The method according to claim 2, further comprising, after removing the substrate, arranging a wavelength-converting material in a free space produced as a result of removing the substrate.

4. The method according to claim 2, wherein removing the substrate is carried out by a laser detaching process.

5. The method according to claim 4, wherein the substrate is formed as a sapphire substrate.

6. The method according to claim 1, wherein embedding the optoelectronic semiconductor chip into the sacrificial layer is carried out by immersing the optoelectronic semiconductor chip in the material of the sacrificial layer.

7. The method according to claim 1, further comprising, after dissolving away the sacrificial layer, arranging a wavelength-converting material above the optoelectronic semiconductor chip.

8. The method according to claim 1, further comprising, after dissolving away the sacrificial layer, arranging a potting material in a free space produced as a result of dissolving away the sacrificial layer.

9. The method according to claim 1, further comprising, before arranging the optoelectronic semiconductor chip on the auxiliary carrier, galvanically depositing internal electrical contact pads at the electrical contact locations of the optoelectronic semiconductor chip.

10. The method according to claim 1, further comprising, before arranging the optoelectronic semiconductor chip on the auxiliary carrier, galvanically depositing internal electrical contact pads at the electrical contact locations of the optoelectronic semiconductor chip, depositing the internal electrical contact pads is carried out before arranging the optoelectronic semiconductor chip on the temporary carrier, and the internal electrical contact pads are embedded into the temporary carrier such that the layer sequence is in contact with the temporary carrier.

11. The method according to claim 9, further comprising, after arranging the molding material, removing a part of the molding material to expose the internal electrical contact pads; and arranging external electrical contact pads electrically conductively connected to the internal electrical contact pads at an exterior side of the housing.

12. The method according to claim 1, wherein the optoelectronic semiconductor chip is arranged together with a plurality of further optoelectronic semiconductor chips on the auxiliary carrier, a housing assemblage comprising a plurality of housings is formed from the molding material, and the housing assemblage is subsequently divided to singulate the housing.

* * * * *